United States Patent [19]
Buess et al.

[11] Patent Number: 5,206,592
[45] Date of Patent: Apr. 27, 1993

[54] DETECTION OF EXPLOSIVES BY NUCLEAR QUADRUPOLE RESONANCE

[76] Inventors: Michael L. Buess, 4337 Taney Ave., Apt. #304, Alexandria, Va. 22304; Allen N. Garroway, 13404 Kris Ran Ct., Fort Washington, Md. 20744; Joel B. Miller, 3003 Crest Ave., Cheverly, Md. 20785

[21] Appl. No.: 704,744

[22] Filed: May 23, 1991

[51] Int. Cl.$^5$ .............................. G01R 33/20
[52] U.S. Cl. ..................... 324/307; 324/318
[58] Field of Search ............ 324/300, 307, 309, 310, 324/313

[56] References Cited

U.S. PATENT DOCUMENTS

| | | | |
|---|---|---|---|
| 4,166,972 | 9/1979 | King et al. | 324/310 |
| 4,296,378 | 10/1981 | King | 324/313 |
| 4,514,691 | 4/1985 | De Los Santos | 324/310 |
| 4,887,034 | 12/1989 | Smith | 324/307 |

OTHER PUBLICATIONS

Karpowica et al., "Librational Motion of Hexahydro-1,3,5-trinitro-s-triazine Based on the Temperature Dependence of the Nitrogen-14 Nuclear Quadrupole Resonance Spectra: The Relationship to Doncuensed--Phase Thermal Decomposition", J. Phys. Chem. 87 (1983), pp. 2109-2112.

Marino, "Nitrogen-14 Nor and Intrigen-15 Wide Line NMR Spectroscopic Studies of Nitrocellulose", Article in Final Technical Report for Task 7-09 Submitted to Battelle, P.O. Box 12207, RPT, NC 27707, Oct. 30, 1987.

Klainer et al., "Fourier Transform Nuclear Quadrupole Resonance Spectroscopy", printed in Fourier Transform NQR in Fourier, Hadamard, and Hilbert Transforms in Chemistry, published 1982, pp. 147-182.

J. C. Sethares et al., "A New Model for the Flat Conductor Electromagnetic Saw Transducer", J. Appl. Phys. 49(3), Mar. 1978 pp. 1054-1060.

Buess et al., "NQR Detection Using a Meanderline Surface Coil", accepted for publication in Journal of Magnetic Resonance, Mar. 1991 issue.

Gove, ed. *Webster's Third New International Dictionary*, G. & C. Merriam Co., Springfield, Mass. 1964.

Journal of Molecular Structure 58 (1980) pp. 63-77 Hirschfeld, "Short Range NQR measurements".

Primary Examiner—Michael J. Tokar
Assistant Examiner—Raymond Y. Mah

[57] ABSTRACT

A system and method for detecting a class of explosives and narcotics containing nitrogen in a specimen by nuclear quadrupole resonance which improves the selectivity, sensitivity and spatial localization over conventional detection systems. As a result, sub-kilogram quantities of explosives and narcotics against a background of more benign materials may be detected by the nuclear quadrupole resonance system and method. Also, by the use of a meanderline surface coil, the electrical and magnetic fields will fall off rapidly over a short distance so that a localized region may be scanned and people may be scanned without depositing substantial RF power into the body. Furthermore, by using a strong off-resonance comb (SORC) irradiation sequence, the signal-to-noise ratio of the detected signal is improved for obtaining a more accurate detection signal from the specimen.

19 Claims, 6 Drawing Sheets

DETECTION OF EXPLOSIVES BY NUCLEAR QUADRUPOLE RESONANCE

BACKGROUND OF THE INVENTION

1. Field of the Invention

The present invention is directed to a method and a system for detecting nitrogenous explosives or narcotics by nuclear quadrupole resonance (NQR).

2. Description of the Prior Art

In order to limit the unrestricted flow of explosives and narcotics, it is desired to detect sub-kilogram quantities of those materials in monitoring stations. Most military explosives and narcotics share common features: they are crystalline solids containing nitrogen. Presently, the explosive detections system and methods cannot reliably detect sub-kilogram quantities of military explosives against a background of more benign materials.

In conventional vapor-based systems, dynamites and contaminated explosives may be detected. However, military explosives such as RDX and PETN are not reliably detected by the conventional vapor base systems especially when countermeasures are taken to reduce the effluent vapor and particles. Thermal neutron systems, which are $^{14}N$ detectors, can detect relevant quantities of explosives. Unfortunately, conventional thermal neutron analysis systems frequently alarm on nitrogen-containing plastics. High false alarm rates are produced for inspected bags containing a few bomb equivalents of nitrogen in a benign form since the conventional thermal neutron analysis systems are sensitive only to the nuclear cross sections and not to any details of the particular chemical environment of the detected nitrogen nucleus. Hence the false alarm rate is inherently high, even with some spatial discrimination. Also, nuclear magnetic resonance (NMR) has been considered for detecting explosives. Because a large magnetic field is conventionally required for NMR, magnetically recorded data would be undesirable altered and other magnetizable materials could be damaged. Furthermore, the conventional non-vapor methods and systems are not suitable for inspecting people.

SUMMARY OF THE INVENTION

An object of the present invention is to provide a system for detecting nitrogenous explosives and narcotics by nuclear quadrupole resonance.

A further object of the present invention is to perform the detection with a meanderline surface coil in order to localize the inspection region for improving the sensitivity to the desired explosive or narcotic.

A still further object of the present invention is to irradiate the specimen to be detected with a train of radio frequency pulses whose frequency has been chosen near to the $^{14}N$ NQR frequency of the explosives or the narcotics desired to be detected.

Another object of the present invention is to provide a method for detecting nitrogenous explosives and narcotics by nuclear quadrupole resonance.

The objects of the present invention are fulfilled by providing a system for detecting a class of explosives and narcotics containing nitrogen in a specimen by nuclear quadrupole resonance, comprising pulse generating means for generating a train of radio frequency pulses having a predetermined frequency, a meanderline surface coil for irradiating the specimen with said train of radio frequency pulses and detecting an integrated nitrogen signal in response to irradiating the specimen, coupling means for transmitting said train of radio frequency pulses to said meanderline surface coil and receiving said integrated nitrogen signal from said surface meanderline coil, comparing means for comparing said integrated nitrogen signal to a predetermined threshold value, and an alarm for signaling when said integrated nitrogen signal exceeds said predetermined threshold value.

Because the NQR resonance frequency of a quadrupolar nucleus in a crystalline solid is well-defined and is especially sensitive to the chemical structure, false alarms from nitrogenous materials having NQR resonances at frequencies other than the characteristic frequencies of the explosives are not a problem. Also, the meanderline surface coil localizes the sensitive inspection region to a well-defined region adjacent to the coil so that a specimen can be scanned without the use of substantial RF power. As a result of the electrical and magnetic fields of the meanderline surface coil falling off rapidly over distance, a person can be scanned by this system without depositing significant RF power into the body.

For simplicity the system uses a single meanderline surface coil for transmission and reception in an embodiment of the present invention. However, it may be advantageous to use two independent coils, for example a meanderline transmitting coil and a solenoidal receiver coil under certain circumstances.

In another embodiment of the present invention, the train of radio frequency pulses irradiating the specimen comprise a strong off resonance comb of radio frequency pulses. By irradiating the specimen with the strong off resonance comb of radio frequency pulses, the signal-to-noise ratio of the detected signal may be improved.

The objects of the present invention are further fulfilled by providing a method for detecting a class of explosives and narcotics containing nitrogen in a specimen by nuclear quadrupole resonance comprising the steps of generating a train of radio frequency pulses having a predetermined frequency, transmitting said train of radio frequency pulses to a meanderline surface coil, irradiating the specimen with said train of radio frequency pulses transmitted to said meanderline surface coil, detecting an integrated nitrogen signal in response to irradiating the specimen, receiving said integrated nitrogen signal, comparing said integrated nitrogen signal to a predetermined threshold value and signaling when said integrated nitrogen signal exceeds said predetermined threshold value. In another embodiment of the present invention, said train of radio frequency pulses generated by the method comprises a strong off resonance comb of radio frequency pulses.

The methods and systems for the embodiments of the present invention improve the selectivity, sensitivity and the spatial localization for detecting nitrogenous explosives or narcotics by nuclear quadrupole resonance. This system also allows for people to be scanned without the RF heating problem associated with immersing a person entirely in an intense RF field. Furthermore, the false alarm rates are reduced so that nitrogenous explosives and narcotics may be reliably detected.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
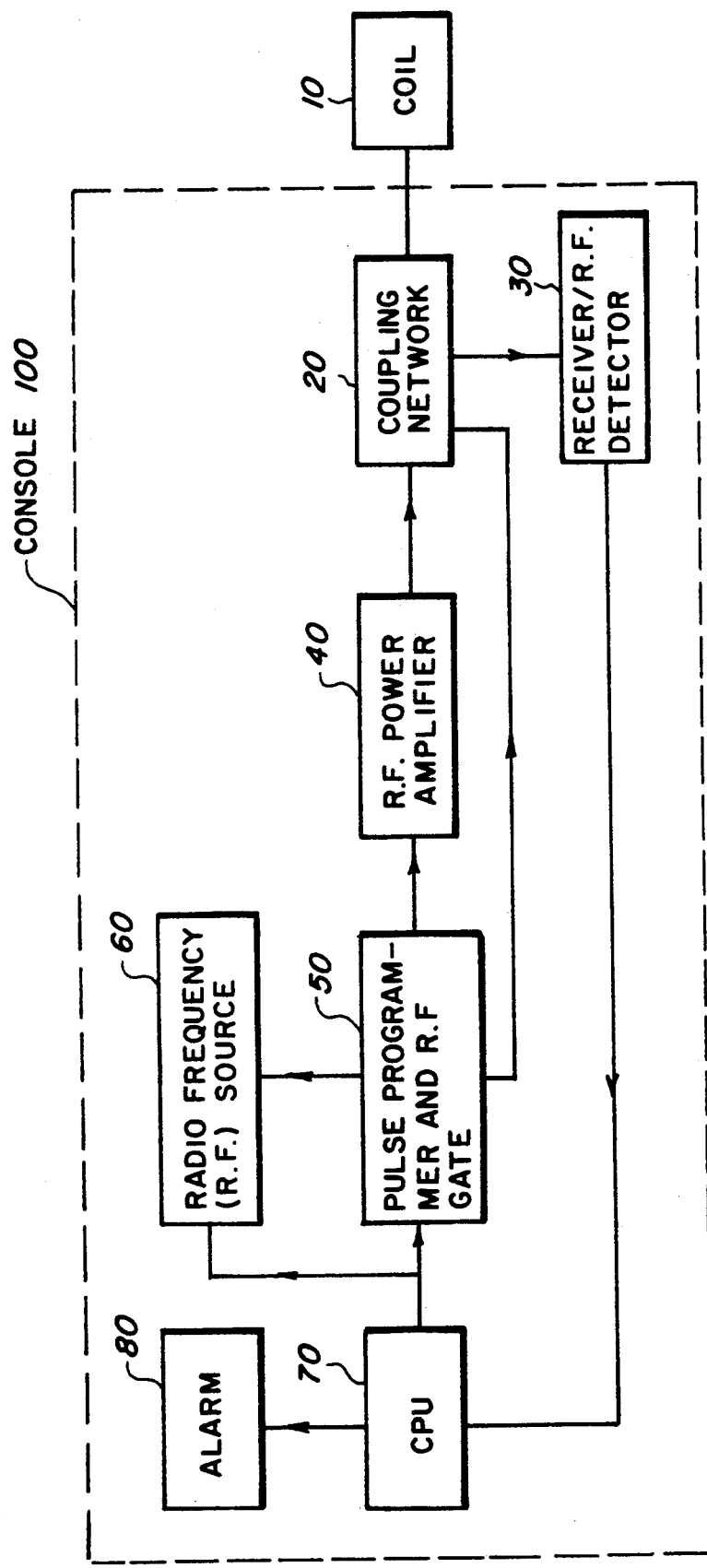
FIG. 1 illustrates a block diagram of the NQR system for the present invention.

FIG. 1 illustrates a block diagram for the NQR detection system for an embodiment of the present invention. A radio frequency source 60, a pulse programmer and RF gate 50 and an RF power amplifier 40 are provided to generate a train of radio frequency pulses having a predetermined frequency to be applied to a coil 10. A coupling network 20 conveys the train of radio frequency pulses from the radio frequency source 60, the pulse programmer and RF gate 50 and the RF power amplifier 40 to the coil 10. The coupling network 20 also conducts the signal to the receiver/RF detector 30 from the coil 10 after a specimen is irradiated with the train of radio frequency pulses. A central processing unit (CPU) 70 controls the radio frequency source 60 and the pulse programmer and RF gate 50 to a predetermined frequency which coincides or is near to a $^{14}N$ NQR frequency of the type of explosive (eg all RDX-based explosives) or narcotic desired to be detected. The CPU 70 also compares the integrated nitrogen signal with a predetermined threshold value. When the predetermined threshold value is exceeded, an alarm 80 is activated in response to the comparison by the CPU 70. The coupling network 20, the receiver/RF detector 30, the RF power amplifier 40, the pulse programmer and RF gate 50, the radio frequency source 60, the CPU 70 and the alarm 80 may be contained in a console 100 with only the coil 10 being outside of the console 100.

Figure 2A:
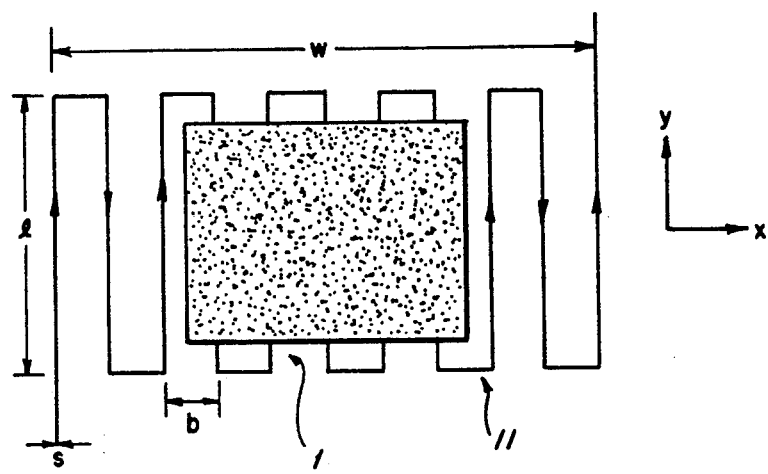
FIGS. 2A and 2B illustrate top and side views of a meanderline surface coil for an embodiment of the present invention with respect to a sample.
Figure 2B:
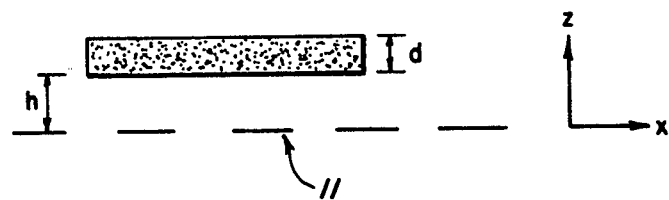

FIGS. 2A and 2B further illustrate the coil 10 as a meanderline surface coil II having a width w and a length l for detecting $^{14}N$ pure NQR signals of a sample 1. The meanderline surface coil 11 is constructed of a serpentine array of parallel conductors being separated by a predetermined distance b. The conductor strips can theoretically be regarded as infinitely thin but having a finite width of s. FIG. 2B illustrates the sample 1, which has a thickness of d, being a height h above the surface of the meanderline surface coil 11.

In order to detect $^{14}N$ pure NQR signals, it is necessary to use a coil producing an RF magnetic field which is confined as much as possible to the region of interest. The magnetic field in planes parallel to the surface of the meanderline surface coil 11 has a periodicity of the meanderline spacing b and the strength of the magnetic field drops off approximately at exp $(-\pi h/b)$ so that the effective RF magnetic field is confined to a region adjacent to the meanderline surface coil 11 with a penetration depth determined by the spacing b between the parallel conductors and not the overall size of the coil. As a result, the meanderline surface coil 11 is optimally suited for probing a sizable surface area to a limited depth. By contrast, the penetration depth of a more conventional circular surface coil is determined by the coil radius: making the circular surface coil larger increases the penetration depth.

The excitation and detection performed by the coil 10 utilizes a pure nuclear quadrupole resonance performed in zero magnetic field so that no magnet is required. In the preferred embodiment, a meanderline surface coil 11 as illustrated in FIGS. 2A and 2B is used. However, for certain specific geometries other coils may be quite suitable: for example, a conventional solenoid, rectangular solenoid, Helmholtz, or toroidal coil may be used. The specimen 1 is irradiated with a train of radio frequency pulses developed by the RF power amplifier 40, the pulse programmer and RF gate 50, the radio frequency source 60 and the CPU 70 to have a frequency near to the $^{14}N$ NQR frequency of the type of explosives or narcotics desired to be detected. For example, RDX has NQR resonance lines near 1.8, 3.4 and 5.2 MHz and PETN has resonance lines near 0.4, 0.5 and 0.9 MHz. Hence all RDX-types of explosive would be detected by examination near to 1.8, 3.4 or 5.2 MHz.

In a preferred embodiment, the train of radio frequency pulses is a strong off resonance comb (SORC) of radio frequency pulses. For pulse separations $\tau$ less than the spin-spin relaxation time $T_2$, the size of the steady state response signal after every pulse is about ½ of the equilibrium magnetization. For a particular geometry the RF pulses are approximately 50 microseconds long and are spaced approximately 1 millisecond apart. In approximately 5 seconds, for example, 5000 signals can be coadded in order to improve the signal-to-noise ratio when compared to a single pulse or a conventional data taking approach which requires a delay approximately equal to the spin-lattice relaxation time $T_1$. Because $T_1$ for $^{14}N$ is typically in the order of seconds, the improvement in the signal-to-noise ratio obtained in a given amount of time by using the SORC sequence is $(T_1/\tau)^{\frac{1}{2}}$ a factor of approximately 30 in this example.

The predetermined frequency of the train of radio frequency pulses for the particular type of explosive or narcotic being detected is set to within 5 to 10 kHz of the nitrogen resonance. Because the resonance frequency is temperature dependent, it is desirable to sweep the frequency over a range of 10 or 15 kHz. For example, the 5.2 MHz resonance lines of RDX vary by approximately 25 kHz over a temperature range of 0° C. to 50° C. while the 1.8 and 3.4 MHz lines of RDX vary by approximately 12.5 kHz over the temperature range of 0° C. to 50° C. Within the frequency sweep of 10 to 15 kHz, the signal intensity will vary proportional to $|\cos(\pi\delta f\tau)|$ where $\delta f$ is the resonance frequency offset. It is to be noted that the swept signal intensity will sum to a positive value even though the exact resonance frequency may be unknown.

After applying the train of radio frequency pulses to the coil 10, the integrated nitrogen signal from the coil passes through a receiver/RF detector 30 and is input to the CPU 70. The integrated nitrogen signal is compared to a predetermined threshold value and the alarm 80 is activated when the integrated nitrogen signal exceeds the predetermined threshold value.

In an embodiment of the present invention, the coupling network 20, the receiver/RF detector 30, the RF power amplifier 40, the pulse programmer and RF gate 50, the radio frequency source 60, the CPU 70 and the alarm 80 are contained in a console 100 with the coil 10 attached thereto so that the scanner coil can be placed next to the specimen desired to be detected.

The above described device may be slightly modified for use in many applications. For example, when inspecting reasonably small packages of approximately 30 cm linear dimensions where power deposition is not a great concern, a cylindrical or rectangular solenoidal coil may be appropriate. For larger packages such as airline baggage, a localized coil may be desired for searching one region of the specimen at a time so that large RF fields are not generated over the entire specimen. When inspecting people, a meanderline surface coil is preferred to be used because the inspection region is localized to a well-defined region and the RF power deposition into the body is minimized. The system and method may be used for inspecting more than one type of nitrogenous explosives or narcotics by jumping to another NQR frequency of the desired type of explosive or narcotic to be detected. Also, more than one type may be simultaneously detected with a plurality of coils and transmitters, by electronically hopping among desired NQR resonance frequencies during the pulse train or by utilizing multiply tuned coils.

FIG. 2A indicates the direction of the current flow in the serpentine array. A current density $J_s(x)$ is related to the total current I as illustrated in the relationship of $$\int_0^{s/2} J_s(x)dx = 1/2I. \quad [1]$$

Figure 3:
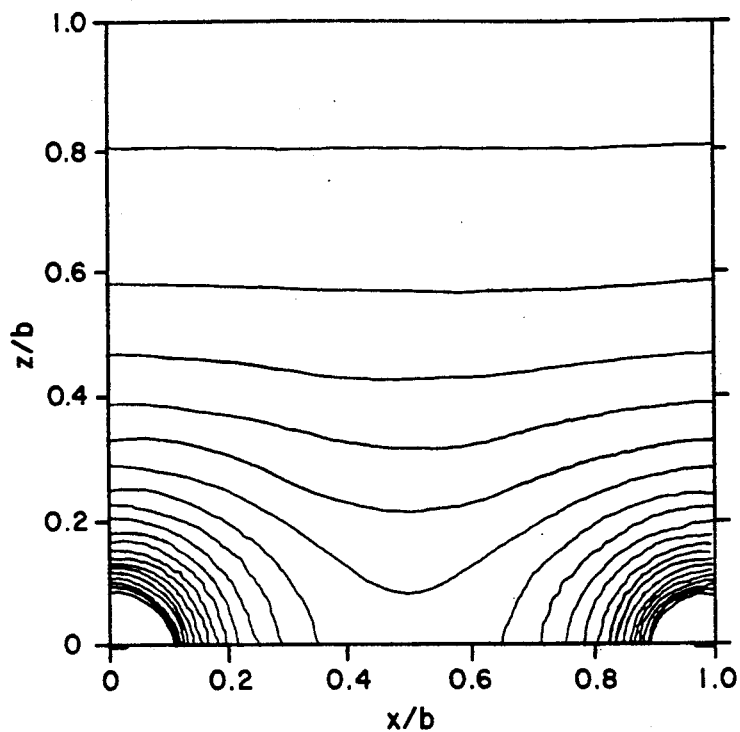
FIG. 3 illustrates the contour lines for the magnetic field strength of a meanderline surface coil in the XY plane.

By using magnetostatic boundary conditions, $J_s(x)$ between the conducting strips is 0 and $J_s(x)$ within the conducting strips corresponds to the relationship of $$J_s(x) = \frac{2\beta}{(2[\cos(2\pi x/b) - \cos(\pi s/b)])^{\frac{1}{2}}}, \quad [2]$$

where $\beta = \pi I[2bK(q)]^{-1}$ and $K(q)$ is the complete elliptic interval of the first kind with modulus $q = \sin(\pi s/2b)$. The resulting magnetic field components in the region of $z>0$ and $B_y=0$ is $$B_{\binom{x}{z}} = \binom{-}{+}\mu_0\beta \sum_{n=0}^{\infty} P_n[\cos(\pi s/b)]\exp[-(2n+1)\pi z/b] \times \binom{\cos}{\sin}[(2n+1)\pi x/b], \quad [3]$$

where $P_n[\cos(\pi s/b)]$ is a Legendre polynomial of order n. In a thin layer sample adjacent to a meanderline surface coil, both the strength and direction of the RF magnetic field vary over the specimen according to equation [3]. An average must be taken at each location within the sample in order to obtain the NQR signal intensity. The quantity of interest in NQR detection is the magnitude of the RF field $B_1 = 2[B_x^2 + B_z^2]^{\frac{1}{2}}$. FIG. 3 illustrates the contour presentation of the magnetic field intensity from equation 3 and predicts the RF field profile. As illustrated in FIG. 3, the z component of the magnetic field reaches a maximum midway between the conducting strips and the modules of the magnetic field is maximum near the strip edges where $B_x$ is large but the magnetic field never vanishes between the conducting strips due to the contribution of $B_z$.

Figure 4:
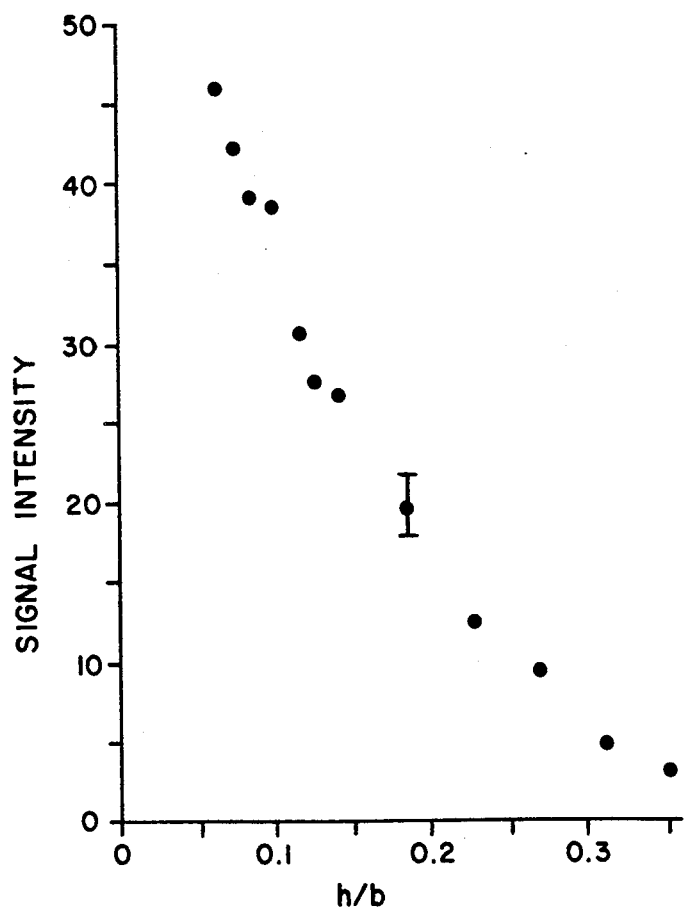
FIG. 4 illustrates the NQR signal intensity as a function of the sample height above the meanderline surface coil.

FIG. 4 illustrates a variation of the NQR signal intensity as a function of the sample height. Data were acquired by using the SORC pulse sequence at a spectrometer offset frequency of 5 kHz, a pulse interval of $\tau = 1.5$ ms and a pulse width of 60 $\mu$s. Two thousand transients were coadded during each sequence for a total acquisition time of about 3 seconds. The meanderline detected NQR intensities qualitatively illustrate the expected rapid decrease in signal intensity with an increasing sample height in FIG. 4. In an application of the meanderline surface coil 11, a sample of 120 grams of commercially obtained sodium nitrite was ground to a fine powder filling a volume of 100 cm$^3$ and was placed in a plastic tray for use as the specimen 1 to be detected. An example of the construction for the meanderline surface coil used bare copper ribbon wire (0.8×3 mm) which was laid out in 11 strips on a perforated printed circuit board where l=20 cm, b=4 cm and W =41 cm. For comparison, a solenoid having dimensions comparable to the dimensions of the meanderline surface coil was used as the coil 10. The solenoid was constructed to have 5.5 turns of the bare copper ribbon wire on a 15 cm diameter plexiglass pipe with the same overall wire length and diameter $D = 2/\pi (1+b)$. The winding spacing of the solenoid was 6.5 cm and the solenoid length was 36 cm. The specimen for the solenoid was again 100 cm$^3$ of sodium nitrite in a cylinder of diameter 2.5 cm filled to a height of 20 cm.

Figure 5:
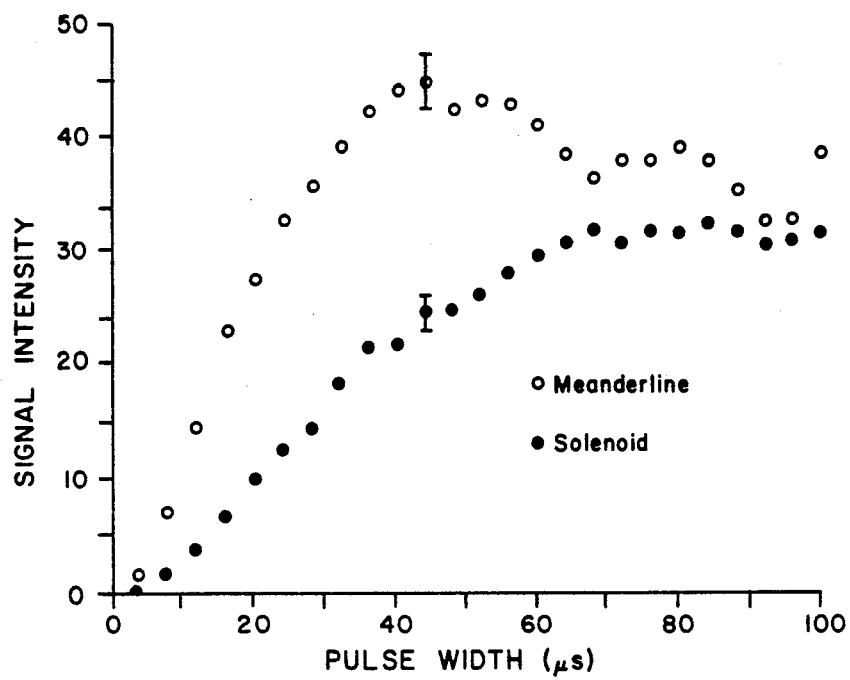
FIG. 5 illustrates the NQR signal intensity as a function of the pulse width for a meanderline surface coil and an equivalent solenoid.
Figure 6:
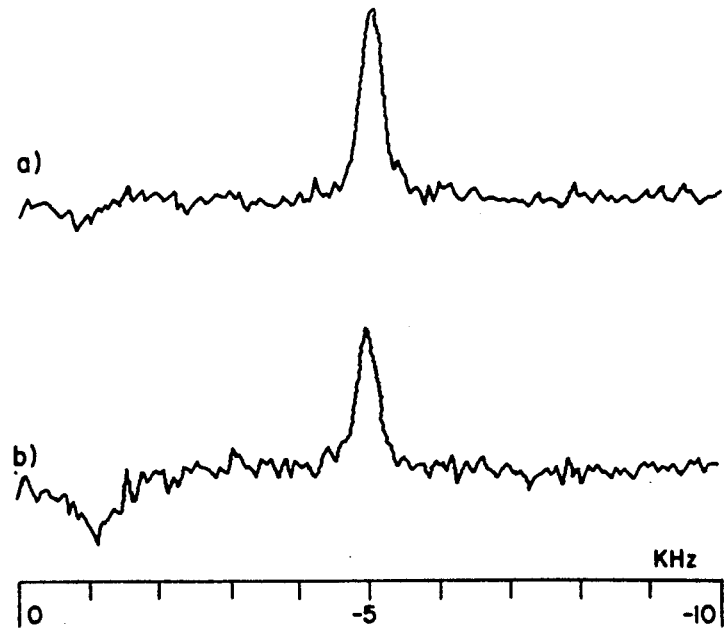
FIG. 6 illustrates a comparison between the NQR spectra for a specimen between a meanderline surface coil and an equivalent solenoid.

A comparison of the RF field between the meanderline surface coil and the solenoid is illustrated in FIG. 5. The signal intensity for the solenoid levels off at pulse widths longer than 80 $\mu$s while the signal intensity for the meanderline surface coil appears to peak at pulse widths between 40 and 50 $\mu$s which suggests that the average magnetic field $B_1$ of the meanderline surface coil is approximately twice as large as the magnetic field $B_1$ for the solenoid in the detection region. Hence the efficiency of the meanderline and its equivalent solenoid are quite comparable, at least in the vicinity of the surface of the meanderline coil. FIG. 6 also makes this point by comparing signals from the meanderline and equivalent solenoid: note that the signal-to-noise ratios are quite comparable.

Figure 7:
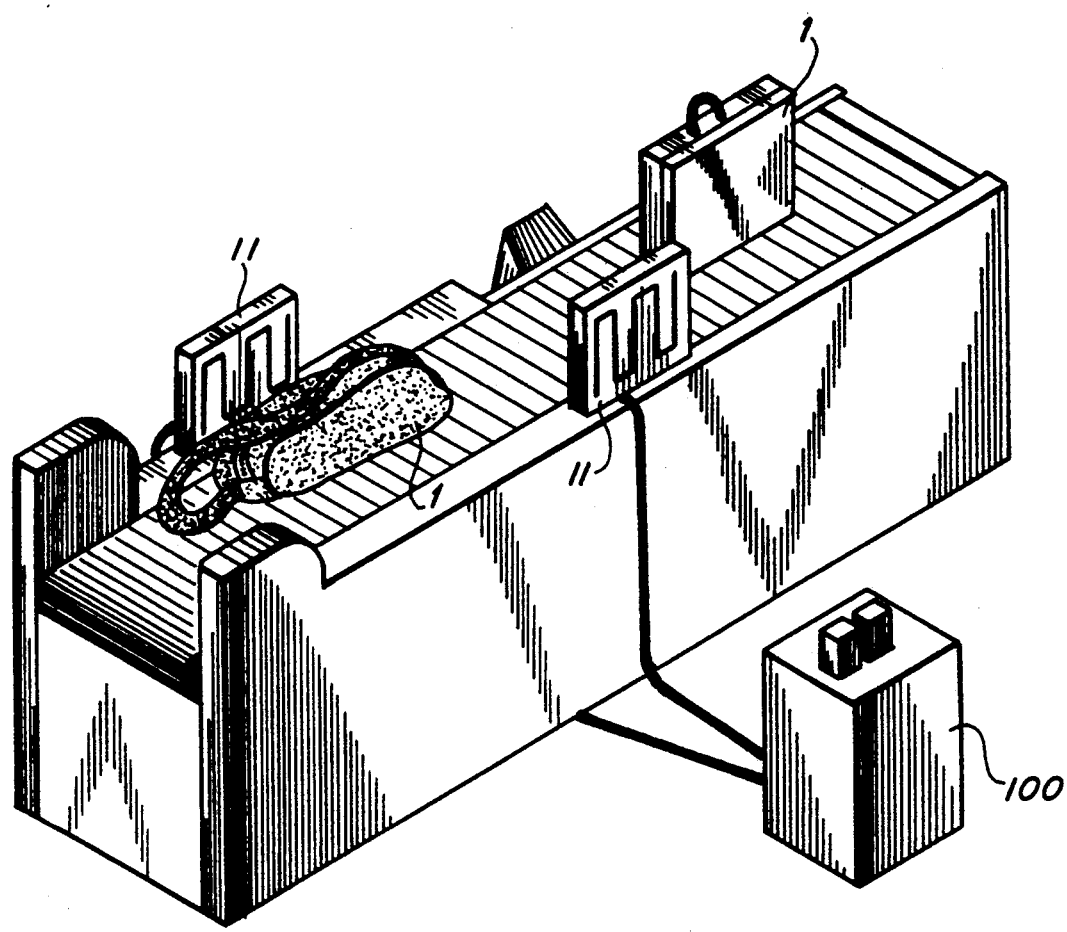
FIGS. 7 and 8 illustrate the implementation of the NQR detection system for the present invention.
Figure 8:
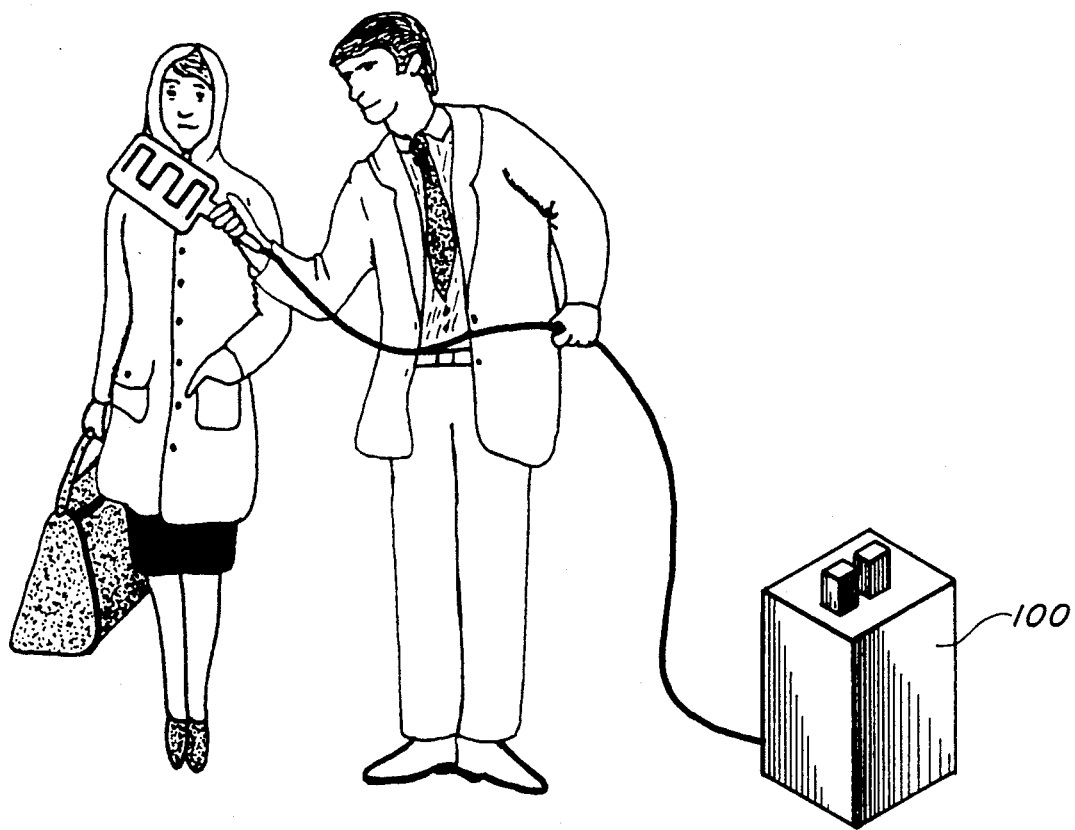

FIGS. 7 and 8 illustrate possible use of such an NQR system for detecting explosives and narcotics. For clarity in FIG. 7 two meanderline inspection coils are shown quite far from the baggage to be inspected. In such an application, the geometry would be altered to bring the coils much closer to the bags.

The system and methods in the embodiments of the present application provide an improvement for detecting a class of explosives and narcotics containing nitrogen in a specimen by nuclear quadrupole resonance over conventional detection systems. The NQR system provides improved specificity and hence reduced false alarm rates because NQR is sensitive to chemical structure. Also, the meanderline surface coil allows sensitivity and localization of the transmitting field and the receiver which allows the possibility of scanning a person without depositing substantial RF power into one's body. Furthermore, the SORC irradiation sequence improves the signal-to-noise ratio of the obtained signal over conventional systems and methods.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A system for detecting a class of explosives and narcotics containing nitrogen in a specimen by nuclear quadrupole resonance, comprising:
   pulse generating means for generating a train of radio frequency pulses having a predetermined frequency;
   a meanderline surface coil for irradiating the specimen with said train of radio frequency pulses and detecting an integrated nitrogen signal in response to irradiating the specimen;
   coupling means for transmitting said train of radio frequency pulses to said meanderline surface coil and receiving said integrated nitrogen signal from said surface meanderline coil;
   comparing means for comparing said integrated nitrogen signal to a predetermined threshold value; and
   an alarm for signalling when said integrated nitrogen signal exceeds said predetermined threshold value.

2. A system according to claim 1, wherein said predetermined frequency of said train of radio frequency pulses are near to a $^{14}N$ NQR frequency of a predetermined type of explosive or narcotic to be detected.

3. A system according to claim 2, wherein said predetermined type of explosive or narcotic to be detected comprises RDX-based explosives.

4. A system according to claim 1, wherein said train of radio frequency pulses comprises a strong off-resonance comb of radio frequency pulses.

5. A system according to claim 1, wherein said pulse generating means comprises a radio frequency source, a pulse programmer, a radio frequency gate and a radio frequency power amplifier.

6. A system for detecting multiple types of nitrogen in a specimen by nuclear quadrupole resonance, comprising:
   pulse generating means for generating a plurality of trains of radio frequency pulses, each said train of radio frequency pulses having a distinct predetermined frequency;
   a plurality of meanderline surface coils for irradiating the specimen with each of said predetermined frequencies for said plurality of trains of radio frequency pulses and detecting a plurality of integrated nitrogen signals in response to irradiating the specimen with each of said distinct predetermined frequencies;
   a plurality of coupling means for respectively transmitting each of said plurality of said trains of radio frequency pulses to each of said meanderline surface coils and respectively receiving said integrated nitrogen signals from each of said meanderline surface coils;
   comparing means for comparing each of said integrated nitrogen signals to a predetermined threshold value; and
   an alarm for signalling when each of said integrated nitrogen signals exceeds said predetermined threshold value.

7. A system according to claim 6, wherein each of said distinct predetermined frequencies of said trains of radio frequency pulses is near to one of a plurality of $^{14}N$ NQR frequencies for each type of the multiple types of nitrogen to be detected.

8. A system according to claim 6, wherein each of said plurality of trains of radio frequency pulses comprises a strong off-resonance comb of radio frequency pulses.

9. A system according to claim 6, wherein said pulse generating means comprises a radio frequency source, a pulse programmer, a radio frequency gate and a radio frequency power amplifier.

10. A system for detecting multiple types of explosives and narcotics containing nitrogen in a specimen by nuclear quadrupole resonance, comprising:
    pulse generating means for generating a plurality of trains of radio frequency pulses, each said train of radio frequency pulses having a distinct predetermined frequency;
    a meanderline surface coil for sequentially irradiating the specimen with each of said distinct predetermined frequencies for said plurality of trains of radio frequency pulses and detecting a plurality of integrated nitrogen signals in response to sequentially irradiating the specimen with each of said distinct predetermined frequencies;
    coupling means for sequentially transmitting each of said trains of radio frequency pulses to said meanderline surface coil and sequentially receiving said integrated nitrogen signals from said meanderline surface coil;
    comparing means for comparing each of said integrated nitrogen signals to a predetermined threshold value; and
    an alarm for signalling when each of said integrated nitrogen signals exceeds said predetermined threshold value.

11. A system according to claim 10, wherein each of said distinct predetermined frequencies of said trains of radio frequency pulses is near to one of a plurality of $^{14}N$ NQR frequencies for each type of the multiple types of explosives or narcotics to be detected.

12. A system according to claim 10, wherein each of said trains of radio frequency pulses comprises a strong off-resonance comb of radio frequency pulses.

13. A system according to claim 10, wherein said pulse generating means comprises a radio frequency source, a pulse programmer, a radio frequency gate and a radio frequency power amplifier.

14. A system for detecting a class of explosives and narcotics containing nitrogen in a specimen by nuclear quadrupole resonance, comprising:
    pulse generating means for generating a train of radio frequency pulses having a predetermined frequency;
    a meanderline coil for irradiating the specimen with said train of radio frequency pulses and detecting an integrated nitrogen signal in response to irradiating the specimen;

coupling means for transmitting said train of radio frequency pulses to said coil and receiving said integrated nitrogen signal from said coil;

comparing means for comparing said integrated nitrogen signal to a predetermined threshold value; and an alarm for signalling when said integrated nitrogen signal exceeds said predetermined threshold value.

15. A system according to claim 14, where said predetermined frequency of said train of radio frequency pulses is near to a $^{14}$N NQR frequency of the type of explosive or narcotic to be detected.

16. A system according to claim 14, wherein said train of radio frequency pulses comprises a strong off-resonance comb of radio frequency pulses.

17. A method for detecting a class of explosives and narcotics containing nitrogen in a specimen by nuclear quadrupole resonance, comprising the steps of:

(a) generating a train of radio frequency pulses having a predetermined frequency;

(b) transmitting said train of radio frequency pulses to a meanderline surface coil;

(c) irradiating the specimen in response to said train of radio frequency pulses transmitted to said meanderline surface coil at said step (b);

(d) detecting an integrated nitrogen signal in response to irradiating the specimen at said step (c);

(e) receiving said integrated nitrogen signal detected at said step (d);

(f) comparing said integrated nitrogen signal to a predetermined threshold value; and (g) signalling when said integrated nitrogen signal exceeds said predetermined threshold value.

18. A method according to claim 17, wherein said step (a) generates said predetermined frequency of said train of radio frequency pulses to be near to a $^{14}$N NQR frequency of the type of explosive or narcotic to be detected.

19. A method according to claim 17 wherein said step (a) generates said train of radio frequency pulses comprising a strong off-resonance comb of radio frequency pulses.

* * * * *